United States Patent [19]

Fujiki et al.

[11] Patent Number: 4,818,735

[45] Date of Patent: Apr. 4, 1989

[54] TETRAGONAL SYSTEM TUNNEL-STRUCTURED COMPOUND AX(GA8MYGA(8+X)-YTI16-X0 56), AND CATION CONDUCTOR AND HEAT INSULATING MATERIAL COMPOSED THEREOF

[75] Inventors: Yoshinori Fujiki; Mamoru Watanabe; Takayoshi Sasaki; Yoshito Onoda, all of Sakura; Tadashi Ohachi, Tsuzuki; Takefumi Mitsuhashi, Sakura, all of Japan

[73] Assignee: National Institute for Research in Inorganic Materials, Ibaraki, Japan

[21] Appl. No.: 13,433

[22] Filed: Feb. 11, 1987

[30] Foreign Application Priority Data

Feb. 14, 1986 [JP] Japan .................................. 61-030524
Apr. 9, 1986 [JP] Japan .................................. 61-081622
May 28, 1986 [JP] Japan .................................. 61-122877
May 29, 1986 [JP] Japan .................................. 61-124095

[51] Int. Cl.$^4$ ............................................. C04B 35/46
[52] U.S. Cl. ................................. 501/134; 156/616.1; 156/623 R; 156/DIG. 70; 156/DIG. 71; 156/DIG. 74; 156/DIG. 75; 252/62; 423/594; 423/595; 423/596; 423/598; 429/33; 429/193

[58] Field of Search .................... 429/33, 193; 252/62; 423/598, 594, 595, 596, 624; 501/134; 156/616.1, 623 R, 624, DIG. 70, DIG. 71, DIG. 74, DIG. 75

[56] References Cited

U.S. PATENT DOCUMENTS 4,034,144 7/1977 Chireau .............................. 501/134

Primary Examiner—Mark L. Bell
Attorney, Agent, or Firm—Oblon, Fisher, Spivak, McClelland & Maier

[57] ABSTRACT

A tetragonal system tunnel-structured compound having the formula:

$$A_x[Ga_8M_yGa_{(8+x)-y}Ti_{16-x}O_{56}] \qquad (I)$$

wherein A is at least one alkali metal selected from the group consisting of K, Rb and Cs, or a solid solution of such alkali metal with lithium, sodium or barium, M is at least one trivalent metal selected from the group consisting of Al, Fe and Cr, x is a number of from 0.1 to 2.0, and y is a number of from 0 to 10.

14 Claims, 1 Drawing Sheet

FIGURE 1(a)
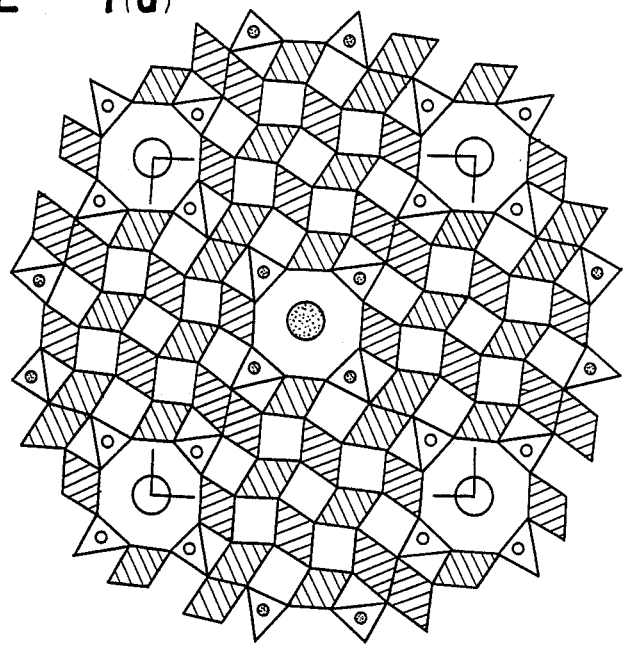
FIGURE 1(b)  FIGURE 1(c)
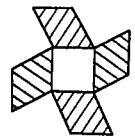 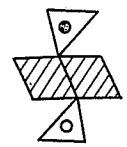
FIGURE 2
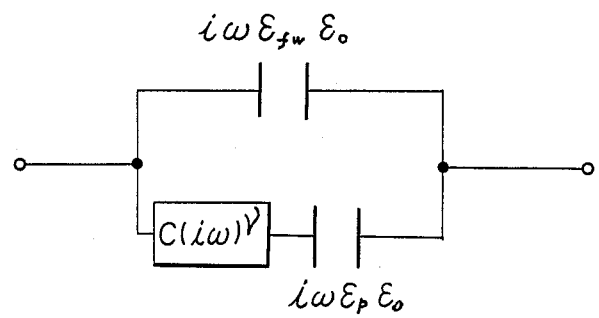

TETRAGONAL SYSTEM TUNNEL-STRUCTURED COMPOUND AX(GA8MYGA(8+X)-YTI16-X0 56), AND CATION CONDUCTOR AND HEAT INSULATING MATERIAL COMPOSED THEREOF

BACKGROUND OF THE INVENTION

1. Field of the Invention

The present invention relates to a novel tetragonal system tunnel-structured compound, and methods of its preparation. The novel compound is useful as a cation conductor, an ion exchanger, a catalyst or a heat resistant heat insulating material.

2. Description of the Background Art

A cation conductor is important as a material for a solid cell of ion sensor useful for electric automobiles or extra electric power for night. Heretofore, the most expected for such a cation conductor has been $\beta$-alumina. However, in such $\beta$-alumina, the movement of cations is in-plane i.e. two dimensional, and the cation conductivity is low. Therefore, it has been desired to develop a material having higher cation conductivity.

On the other hand, as a heat resistant heat insulating material, asbestos has been most widely used. However, asbestos is likely to form a dust during its use, and create a pollution problem. Thus, it has been desired to develop a heat insulating material which can be substituted for asbestos. Recently, potassium titanate fibers have been developed as fibers to be substituted for asbestos, by Fujiki, one of the inventors of this application, et al. (Japanese Pat. Nos. 116,459 and 116,460.) Among ceramics, the potassium titanate fibers are remarkably superior in the heat insulating property. However, they have a drawback that since their melting point is 1370° C., the practically useful temperature is low at a level of up to about 1200° C. Thus, a heat resistant heat insulating material having a higher melting point has been desired.

SUMMARY OF THE INVENTION

It is an object of the present invention to provide a novel compound useful for the above-mentioned purposes.

Another object of the present invention is to overcome the above-mentioned drawback of a conventional cation conductor made of $\beta$-alumina, and to provide a cation conductor having high cation conductivity, whereby the movement of cations is not two dimensional but one dimensional and the direction of the movement of cations can be regulated.

A further object of the present invention is to provide a novel heat resistant heat insulating material having a melting point higher than the above-mentioned potassium titanate fibers.

The present invention provides a tetragonal system tunnel-structured compound having the formula:

$$A_x[Ga_8M_yGa_{(8+x)-y}Ti_{16-x}O_{56}] \quad (I)$$

wherein A is at least one alkali metal selected from the group consisting of K, Rb and Cs, or a solid solution of such alkali metal with lithium, sodium or barium, M is at least one trivalent metal selected from the group consisting of Al, Fe and Cr, x is a number of from 0.1 to 2.0, and y is a number of from 0 to 10.

The compound of the present invention may be prepared by either a calcining method or a flux method. According to the calcining method, powdery crystals will be obtained, whereas according to the flux method, needle-like or fibrous crystals will be obtained.

The calcining method comprises mixing an alkali metal oxide selected from the group consisting of $K_2O$, $Rb_2O$ and $Cs_2O$ or a compound decomposable into such an alkali metal oxide when heated, titanium oxide or a compound decomposable into titanium oxide when heated, gallium oxide or a compound decomposable into gallium oxide when heated, and a trivalent metal compound selected from the group consisting of aluminum oxide, iron oxide and chromium oxide, or a compound decomposable into such a trivalent metal oxide when heated, to have a composition represented by the formula:

$$A_x[Ga_8M_yGa_{(8+x)-y}Ti_{16-x}O_{56}]$$

wherein A, M, x and y are as defined above, and calcining the mixture at a temperature of at least 1000° C.

The flux method comprises mixing an alkali metal oxide selected from the group consisting of $K_2O$, $Rb_2O$ and $Cs_2O$, or a compound decomposable into such an alkali metal oxide when heated, $TiO_2$ or a compound decomposable into $TiO_2$ when heated, $Ga_2O_3$ or a compound decomposable into $Ga_2O_3$ when heated, and a trivalent metal oxide selected from the group consisting of $Al_2O_3$, $Fe_2O_3$ and $Cr_2O_3$, or a compound decomposable into such a trivalent metal oxide when heated, to obtain a crystal material having a composition represented by the formula:

$$(A_2O)_a(TiO_2)_b(M_2O_3)_c(Ga_2O_3)_d$$

wherein A and M are as defined above, each of a and b is a number of from 0.1 to 2.0, c is a number of from 0 to 1.0, and d is a number of from 0.1 to 1.0, mixing $MoO_3$ or a compound decomposable into $MoO_3$ when heated, and an alkali metal oxide selected from the group consisting of $K_2O$, $Rb_2O$ and $Cs_2O$, or a compound decomposable into such an alkali metal oxide when heated, to obtain a flux material having a composition represented by the formula:

$$A_2O \cdot n(MoO_3)$$

wherein A is as defined above, and n is a number of from 1 to 2, then mixing the crystal material and the flux material in a molar ratio of from 30:70 to 10:90, heating and melting the mixture at a temperature of from 1200° to 1400° C., and gradually cooling the melt to a temperature of from 900° to 1000° C. to let a single crystal grow.

The novel compound of the present invention is useful as a cation conductor, an ion exchanger, a catalyst, a heat resistant material and a heat insulating material. It is particularly useful as a cation conductor which is capable of conducting cations one-dimensionally and thus has high conductivity. Further, it is also particularly useful as a heat resistant heat insulating material, since it has a melting point as high as 1560° C. and extremely low heat conductivity.

BRIEF DESCRIPTION OF THE DRAWINGS

FIG. 1 illustrates the crystal structure of the compound of the present invention, wherein (a) shows the entire crystal structure, (b) shows a rutile structural unit represented by $TiO_6$ coordination, and (c) shows a $\beta$- gallia structural unit represented by the coordination of $MO_6$ (M is Ga, Al, Cr, Fe) and $GaO_4$.

FIG. 2 shows an electrically equivalent circuit useful for the analysis of the results of the measurement of the one dimensional cation conductor of the present invention.

DETAILED DESCRIPTION OF THE PREFERRED EMBODIMENTS

The novel compound of the present invention is represented by the formula:

$$A_x[Ga_8M_yGa_{(8+x)-y}Ti_{16-x}O_{56}] \quad (I)$$

wherein A, M, x and y are as defined above. In the compound, $Ti^{4+}$ assumes an octahedral coordination of $TiO_6$, and $M^{3+}$ likewise assumes an octahedral coordination of $MO_6$, whereas $Ga^{3+}$ assumes an octahedral coordination of $GaO_6$ and a tetrahedral coordination of $GaO_4$. Thus, the compound is characterized in that the geometrical interconnection of these coordination polyhedrons constitutes a large tunnel-structure defined by four octahedrons and four tetrahedrons. Further, a x number of $TiO_6$ octahedrons are substituted by trivalent $MO_6$ octahedrons so that a x number of A atoms are coordinated in the tunnel-structure to adjust the cation charge.

A preferred compound of the present invention is represented by the following formula (when y is 0 in the formula I):

$$A_x[Ga_8Ga_{8+x}Ti_{16-x}O_{56}]$$

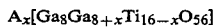

wherein A and x are as defined above. This compound has excellent properties for a cation conductor, an ion exchanger, a refractory material and a heat insulating material. However, gallium is expensive. Therefore, it is advantageous to replace at least $GaO_6$ octahedrons among the coordination polyhedrons occupied by gallium in the crystal structure, by other inexpensive trivalent metals such as Al, Fe and Cr, and thereby to obtain the compound of the formula I wherein y is from 0.1 to 10.

In the formula I, component M may structurally occupy not only all seats for $GaO_6$ octahedrons (y=8 as a half of the total number of seats for Ga) but also other seats up to y=10. This means that in addition to y=8 regularly derived from the seats for $GaO_6$ octahedrons, an additional portion x corresponding to the substitution at the seats for $TiO_6$ octahedrons is added, and when x=2, y=10. If x is less than 0.1, a tetragonal system tunnel-structure is not obtainable.

Now, referring to the drawings (FIG. 1), the structure will be described in further detail. As shown in FIG. 1(a), the crystal structure belongs to a tetragonal system with a space group of I4/m, and has a tunnel-structure having a large diameter. Tetrahedrons are all constituted by $GaO_4$, whereas among octahedrons, those constituting the framework of the large diameter tunnel-structure are $TiO_6$ and $MO_6$, which are distributed in the proportions of 70% and 30%, respectively.

The matrix between large diameter tunnel-structures, is formed by the interconnection of rutile structural units as shown in FIG. 1(b) and $\beta$-gallia structural units as shown in FIG. 1(c).

The compound of the present invention may be prepared by the flux method or the sintering method, as mentioned above. As the compounds decomposable to the respective metal oxide starting materials, when heated, there may be mentioned carbonates, percarbonates, hydroxides, nitrates, halides or oxyhalides of the respective metals.

Now, an application of the compound of the present invention to a cation exchanger will be described.

It has been found that the compound of the present invention conducts cations one dimensionally, whereby the cation conductivity is extremely high. Thus, the cation exchanger of the present invention is composed essentially of a compound of the formula I having a tetragonal system one dimensional tunnel-structure.

The tunnel-structure of the cation conductor of the present invention has structural features which are extremely effective for an ion conductive mechanism, such that it has a large diameter of about 6.5 Å, it is free from bottle necks constituting structural barriers for the ion conduction passages, and the distance between the ion conduction passages is proper so that no adverse interaction takes place.

K, Rb, Cs, or a solid solution of K or Rb with Li or Na, serves as a conductive ion, and each has excellent ion conductivity. Particularly excellent is K, Rb or a solid solution of K or Rb with Li or Na. Further, in the compound, a part (from 0 to 50%) of Ti may be replaced by $Mn^{4+}$.

In the formula I, x is within a range of from 0.1 to 2.0. Preferably, however, x is from 0.6 to 1.2. If x is less than 0.1, it is impossible to obtain a compound having a tetragonal one dimensional tunnel-structure, and if x exceeds 2, the conductivity deteriorates.

The shape of the cation conductor composed of the compound of the present invention may be, if crystalline, granular, powdery, fibrous, bullet-like or bulky. However, from the specificity of the conductive mechanism, it is most preferred that in the crystal, the face perpendicular to the axis of the tunnel-structure, i.e. the face perpendicular to the c-axis of the crystal, is well developed.

Further, most preferably, the cation exchanger is made of a single crystal. Depending upon the method of synthesis, it is possible to obtain a needle-like crystal or a fiber-like crystal extending in parallel with the c-axis of the crystal. In such a case, a plurality of such crystals may be bundled to obtain a large face perpendicular to the c-axis of the crystal.

The crystal of the cation conductor of the present invention may be prepared by any one of a calcining method, a melting method, a hydrothermal method or a flux method. Among them, a flux method wherein a molybdate or a tungstate is used as a flux, is preferred, because the control of the basicity of the melt is easy, the production is accordingly simple, and it is easy to produce a relatively large single crystal. Further, high pressure is not required for the production, thus being free from danger, and the production can be accomplished at a relatively low temperature whereby no pollution by the evaporation of the flux will be caused. The preparation of various solid solutions is simple, and it is possible to readily obtain ion conductors having different properties by solid-solubilizing highly conductive ion species having a small ion radius, such as Na or Li ions, to K or Rb.

The cation conductor of the present invention contains an alkali metal such as K, Rb or Cs as the conductive ion species. Therefore, when it is made into a solid cell, it is no longer required to use an active and dangerous gas as required in the conventional fuel cells, and since it has a special large diameter tunnel-structure, the conductivity at a high frequency can be increased by from 100 to 1000 times the value obtainable by β-alumina at room temperature, by aligning the ion conductive direction one dimensionally.

Now, an application of the compound of the present invention to a heat resistant heat insulating material, will be described.

The compound of the formula I having a tetragonal one dimensional tunnel-structure has been found to have a high melting point of 1560° C. and excellent heat resistance and heat insulating properties with a very small heat conductivity.

In the formula I, x is within a range of from 0.1 to 2.0, preferably from 0.6 to 1.2. If x is less than 0.1, it is difficult to obtain a compound having a tetragonal one dimensional tunnel-structure. On the other hand, component A can not occupy the seat in the tunnel-structure beyond x being 2.

The shape of the heat resistant heat insulating material of the present invention may be granular, powder, fibrous, prismatic, plate-like or bulky, so long as the material is crystalline. The application may be varied depending upon the shape of the material.

Especially if the material is powdery, it can be easily used, since it may be readily formed into a heat resistant heat insulating coating material or into a sintered shaped product. Further, in the case of a fibrous material, it may be employed advantageously as a mat, a sheet, a paper, a coating material for wires or iron bars, or as a reinforcing material for plastics or metals, by virtue of the heat resistant heat insulating properties.

The heat resistant heat insulating material of the present invention may be prepared by any one of a sintering method, a melting method, a hydrothermal method or a flux method. In order to obtain the material in the form of a powder, the sintering method is preferred, and in order to obtain the material in the form of a fiber product, the flux method is preferred.

Now, the present invention will be described in further detail with reference to Examples. However, it should be understood that the present invention is by no means restricted to these specific Examples.

EXAMPLE 1

20 mol % of a crystal material obtained by mixing potassium carbonate powder, titanium oxide powder and gallium oxide powder each having a purity of at least 99.9%, to have a composition of $(K_2O)_{0.7}(TiO_2)_{1.0}(Ga_2O_3)_{0.5}$ and 80 mol % of a flux material obtained by mixing potassium carbonate powder and molybdenum powder to have a compo ition of $(K_2O)(MoO_3)_{1.5}$ were mixed. 123 g of this mixture was put into a 100 ml of platinum cruicible, melted at 1300° C., maintained for 10 hours, and then gradually cooled to 1000° C. at a rate of 4° C./hr. After the gradual cooling, the cruicible was left in air and allowed to cool down to room temperature.

The cruicible was immersed in boiling water to dissolve the flux and to separate crystals. The crystals thus obtained were aggregates of needle-like crystals having a length of 10 mm. From the examination by X-ray diffractometry, these crystals (composition: $K_{0.8}[Ga_{8.8}Ga_{8.8}Ti_{15.2}O_{56}]$) were found to have the index of a plane (hkl), the spacing $(d(Å))(d_{obs}$ is the observed value, and $d_{calc}$ is the calculated value) and the relative reflection intensity to X-rays, as shown in Table 1.

TABLE 1

| | $K_{0.8}[Ga_8Ga_{8.8}Ti_{15.2}O_{56}]$ a = 18.139(1)Å, c = 2.9978(5)Å | | |
|---|---|---|---|
| hkl | $d_{calc}$(Å) | $d_{obs}$(Å) | Intensity |
| 110 | 12.83 | 12.84 | 10 |
| 200 | 9.070 | 9.071 | 100 |
| 220 | 6.413 | 6.410 | 2 |
| 310 | 5.736 | 5.733 | 35 |
| 400 | 4.535 | 4.534 | 2 |
| 330 | 4.275 | 4.278 | <1 |
| 420 | 4.056 | 4.056 | 5 |
| 510 | 3.557 | 3.557 | 5 |
| 440 | 3.207 | 3.206 | 10 |
| 530 | 3.111 | 3.109 | 100 |
| 600 | 3.023 | 3.023 | 5 |
| 620 | 2.868 | 2.867 | 40 |
| 550 | 2.565 | 2.565 | 15 |
| 640 | 2.515 | 2.514 | 10 |
| 411 | 2.477 | 2.477 | 25 |
| 730 | 2.382 | 2.382 | 10 |
| 431 | 2.311 | 2.310 | <1 |
| 800 | 2.267 | 2.268 | 1 |
| 521 | 2.239 | 2.240 | 1 |
| 820 | 2.200 | 2.200 | 15 |
| 660 | 2.138 | 2.138 | 3 |
| 611 | 2.114 | 2.115 | 1 |
| 750 | 2.109 | 2.109 | 2 |
| 840 | 2.028 | 2.028 | <1 |
| 910 | 2.003 | 2.004 | 1 |
| 701 | 1.9604 | 1.9605 | <1 |
| 930 | 1.9120 | 1.9125 | <1 |
| 651 | 1.8360 | 1.8357 | 1 |
| 860 | 1.8139 | 1.8142 | <1 |
| 741 | 1.7995 | 1.7995 | 2 |
| 1020 | 1.7787 | 1.7788 | 3 |
| 950 | 1.7618 | 1.7622 | 2 |
| 1040 | 1.6842 | 1.6837 | 35 |
| 761 | 1.6449 | 1.6448 | 5 |

The space group is I4/m and belongs to a tetragonal system. The lattice constants vary depending upon the composition. In the case of $K_{0.8}[Ga_8Ga_{8.8}Ti_{15.2}O_{56}]$, a=18.135(Å), c=2.9966(Å), the unit volume V=985.5(Å$^3$) and one molecule is contained in a unit lattice, and the density is 4.69 g/cm$^3$ as the measured value. Further, the crystal habit of the crystals is needle-like to fibrous.

EXAMPLES 2 AND 3

Instead of $K_2CO_3$ in Example 1, $Rb_2CO_3$ and $CsCO_3$ were used respectively. In each case, needle-like crystals having the same crystal structure as in Example 1 were obtained.

EXAMPLE 4

The crystal material as used in Example 1, was blended to have a composition of $(K_2O)_{\frac{1}{2}}(TiO_6)_{15.0}(Ga_2O_3)_{17/2}$. About 10 g of the thoroughly blended mixture was sintered at 1200° C. for 1 hour in a 30 ml platinum cruicible, pulverized and mixed, and then again sintered at 1200° C. for 15 hours.

The powder thus obtained: was analyzed by X-ray diffractometry, and was found to have the same crystallographic characteristics as shown in Table 1.

EXAMPLES 5 AND 6

Instead of $K_2O$ in Example 4, $Rb_2O$ and $Cs_2O$ were used, whereby the same results as in Example 4 were obtained.

EXAMPLE 7

Preparation of $K_2[Ga_8Cr_{10}Ti_{14}O_{56}]$ powdery crystals

Powders of potassium carbonate, titanium dioxide, chromium oxide and gallium oxide, were mixed in a molar ratio of $K_2CO_3:TiO_2:Cr_2O_3:Ga_2O_3=1:14:5:4$. Then, about 6 g of this mixture was put into a platinum cruicible and sintered at 1250° C. for 30 minutes. The sintered product was pulverized and mixed and further sintered at 1250° C. for 20 hours. The powdery crystals thus obtained were examined by powder X-ray diffractometry, and the lattice constants were measured. As the results, a=18.139 Å, c=2.9978 Å, unit volume V=987.30 Å, and calculated density=4.57 g/cm³. Further, the index of a plane (hKl), the spacing (dÅ) and the relative reflection intensity (%) to X-rays, were as shown in Table 2.

TABLE 2

| | a = 18.139(1)Å, c = 2.9978(5)Å | | |
|---|---|---|---|
| hkl | $d_{calc}$(Å) | $d_{obs}$(Å) | Intensity |
| 110 | 12.83 | 12.84 | 5 |
| 200 | 9.070 | 9.064 | 40 |
| 220 | 6.413 | 6.421 | 2 |
| 310 | 5.736 | 5.734 | 20 |
| 400 | 4.535 | 4.537 | 1 |
| 420 | 4.056 | 4.057 | 3 |
| 510 | 3.557 | 3.558 | 10 |
| 530 | 3.111 | 3.110 | 100 |
| 600 | 3.023 | 3.023 | 5 |
| 101 | 2.960 | 2.959 | 3 |
| 620 | 2.868 | 2.867 | 25 |
| 301 | 2.688 | 2.688 | 10 |
| 321 | 2.577 | 2.577 | 15 |
| 550 | 2.565 | 2.566 | 15 |
| 640 | 2.515 | 2.515 | 5 |
| 411 | 2.479 | 2.480 | 90 |
| 730 | 2.382 | 2.381 | 5 |
| 431 | 2.312 | 2.313 | 10 |
| 521 | 2.241 | 2.240 | 15 |
| 820 | 2.200 | 2.200 | 5 |
| 660 | 2.138 | 2.138 | 5 |
| 611 | 2.115 | 2.115 | 5 |
| 910 | 2.003 | 2.004 | 3 |
| 701 | 1.9612 | 1.9612 | 3 |
| 651 | 1.8366 | 1.8367 | 5 |
| 741 | 1.8001 | 1.8001 | 10 |
| −1020 | 1.7787 | 1.7790 | 2 |
| 950 | 1.7618 | 1.7617 | 2 |
| 831 | 1.7331 | 1.7334 | 3 |
| 761 | 1.6453 | 1.6452 | 40 |
| 1060 | 1.5554 | 1.5555 | 3 |
| 1011 | 1.5467 | 1.5467 | 10 |

Further, even when in the formula $K_x[Ga_8Cr_yGa_{(8+x)-y}Ti_{16-x}O_{56}]$, x was varied within a range of from 0.1 to 2.0 and y was varied within a range of from 0.1 to 10, satisfactory products were obtained by similar heat treatment.

Furthermore, when instead of K, Rb and Cs were used, respectively, the corresponding crystals were obtained in the same manner.

EXAMPLE 8

Preparation of $K_2[Ga_8Al_6Ga_4Ti_{14}O_{56}]$ powdery crystals

Powders of potassium carbonate, titanium dioxide, aluminum oxide and gallium oxide were mixed in a molar ratio of $K_2CO_3:TiO_2:Al_2O_3:Ga_2O_3=1:14:3:6$. Then, 6 g of this mixture was put into a platinum cruicible and sintered at 1250° C. for 30 minutes. This sintered product was pulverized and mixed, and further sintered at 1250° C. for 20 hours. The powdery crystals thus obtained were analyzed by powder X-ray diffractometry, and the lattice constants were measured. As the results, a=18.057(Å), c=2.9813(Å), unit volume V=972.12(Å³), and calculated density=4.51 (g/cm³).

The index of a plane, the spacing and the relative intensity were as shown in Table 3.

TABLE 3

| | a = 18.057(1)Å, c = 2.9813(5)Å | | |
|---|---|---|---|
| hkl | $d_{calc}$(Å) | $d_{obs}$(Å) | Intensity |
| 110 | 12.77 | 12.82 | 10 |
| 200 | 9.029 | 9.025 | 50 |
| 220 | 6.384 | 6.378 | 2 |
| 310 | 5.710 | 5.714 | 20 |
| 400 | 4.514 | 4.513 | 1 |
| 420 | 4.038 | 4.038 | 5 |
| 510 | 3.541 | 3.541 | 10 |
| 440 | 3.192 | 3.195 | 15 |
| 530 | 3.097 | 3.096 | 100 |
| 600 | 3.010 | 3.009 | 5 |
| 101 | 2.942 | 2.939 | 3 |
| 620 | 2.855 | 2.854 | 30 |
| 211 | 2.797 | 2.798 | 2 |
| 301 | 2.672 | 2.673 | 5 |
| 321 | 2.562 | 2.561 | 20 |
| 550 | 2.554 | 2.554 | 20 |
| 640 | 2.504 | 2.505 | 3 |
| 411 | 2.465 | 2.465 | 70 |
| 730 | 2.371 | 2.371 | 5 |
| 431 | 2.299 | 2.298 | 1 |
| 521 | 2.228 | 2.229 | 20 |
| 660 | 2.128 | 2.128 | 5 |
| 611 | 2.104 | 2.103 | 5 |
| 910 | 1.9941 | 1.9936 | 2 |
| 701 | 1.9508 | 1.9514 | 2 |
| 651 | 1.8270 | 1.8266 | 5 |
| 741 | 1.7907 | 1.7915 | 10 |
| 1020 | 1.7707 | 1.7711 | 1 |
| 950 | 1.7539 | 1.7536 | 1 |
| 1040 | 1.6766 | 1.6762 | 10 |
| 901 | 1.6645 | 1.6645 | 5 |
| 761 | 1.6370 | 1.6363 | 35 |
| 851 | 1.6107 | 1.6108 | 3 |
| 970 | 1.5837 | 1.5844 | 5 |

Further, when in the formula $K_x[Ga_8Al_yGa_{(8+x)-y}Ti_{16-x}O_{56}]$, was varied within a range of from 0.1 to 2.0 and y was varied within a range of from 0.1 to 10, satisfactory products were obtained by similar heat treatment. Furthermore, instead of K, Rb and Cs were used, respectively, the corresponding crystals were obtained in the same manner.

EXAMPLE 9

Preparation of $K_2[Ga_8Fe_4Ga_6Ti_{14}O_{56}]$ powdery crystals

Powders of potassium carbonate, titanium dioxide, iron oxide and gallium oxide were mixed in a molar ratio of $K_2CO_3:TiO_2:Fe_2O_3:Ga_2O_3=1:14:20:7$. Then, 6 g of this mixture was put into a platinum cruicible and sintered at 1250° C. for 30 minutes. The sintered product was pulverized and mixed, and further sintered at 1250° C. for 20 hours. The powdery crystals thus obtained were analyzed by powder-X-ray diffractometry, and the lattice constants were measured. As the results, a=18.182(Å), c=2.979(Å), unit volume V=984.95(Å³), and calculated density=4.79 (g/cm³).

Further, the index of a plane, the spacing and the relative intensity were as shown in Table 4.

TABLE 4

| | a = 18.182(2)Å, c = 2.979(2)Å | | |
|---|---|---|---|
| hkl | $d_{calc}$(Å) | $d_{obs}$(Å) | Intensity |
| 110 | 12.86 | 12.87 | 5 |

TABLE 4-continued

| | a = 18.182(2)Å, c = 2.979(2)Å | | |
|---|---|---|---|
| hkl | $d_{calc}$(Å) | $d_{obs}$(Å) | Intensity |
| 200 | 9.091 | 9.100 | 45 |
| 220 | 6.428 | 6.439 | 1 |
| 310 | 5.750 | 5.748 | 15 |
| 420 | 4.066 | 4.062 | 2 |
| 510 | 3.566 | 3.567 | 5 |
| 530 | 3.118 | 3.118 | 100 |
| 600 | 3.030 | 3.029 | 5 |
| 101 | 2.940 | 2.940 | 5 |
| 620 | 2.875 | 2.875 | 20 |
| 550 | 2.571 | 2.573 | 15 |
| 640 | 2.521 | 2.521 | 5 |
| 730 | 2.387 | 2.386 | 5 |
| 820 | 2.205 | 2.205 | 5 |
| 660 | 2.143 | 2.143 | 5 |
| 750 | 2.114 | 2.113 | 3 |
| 910 | 2.008 | 2.009 | 2 |
| 1020 | 1.7829 | 1.7821 | 2 |
| 950 | 1.7660 | 1.7657 | 2 |
| 880 | 1.6071 | 1.6081 | 2 |
| 1060 | 1.5591 | 1.5587 | 1 |

Further, when in the formula $K_x[Ga_8Fe_yGa_{(8+x-y)}Ti_{16-x}O_{56}]$, x was varied within a range of from 0.1 to 2.0, and y was varied within a range of from 0.1 to 10, satisfactory products were obtained by similar heat treatment. Furthermore, instead of K, Rb and Cs were employed, respectively, the corresponding crystals were obtained in the same manner.

EXAMPLE 10

Preparation of $K_{1.0}[Ga_8Al_2Ga_7Ti_{15}O_{56}]$

Powders of potassium carbonate, titanium dioxide, aluminum oxide and gallium oxide were mixed in a molar ratio of $K_2CO_3:TiO_2:Al_2O_3:Ga_2O_3 = 1:1:0.4:0.6$ to obtain a crystal component.

On the other hand, powders of potassium carbonate and molybdenum oxide were mixed in a molar ratio of $K_2CO_3:MoO_3 = 1:1.5$ to obtain a flux component.

The crystal component and the flux component were mixed in a molar % of 20:80 to obtain a starting material.

Then, 150 g of this starting material was put into a platinum cruicible, melted by maintaining at 1300° C. for 10 hours in a silicon carbide heater electric furnace, and then gradually cooled to 1000° C. at a rate of 4° C./hr. After the gradual cooling, the cruicible was taken out and left to cool in atmospheric air. The cruicible was treated with boiling water to dissolve the flux, and the crystals were taken out.

The crystals thus obtained were analyzed by powder X-ray diffractometry. As the results, it was found that the majority was single crystals of $K_{x[Ga_8Al_yGa_{(8+x-y)}Ti_{16-x}O_{56}]}$, and a small amount of single crystals of priderite $K_xAl_xTi_{8-x}O_{16}$ and a small amount of powdery crystals of $\alpha$-$Al_2O_3$ were present. The composition of the above-mentioned majority of single crystals was found to be $K_{1.0}[Ga_8Al_2Ga_7Ti_{15}O_{56}]$ as a result of the chemical analysis. Large single crystals had a length of 10 mm and a diameter of 100 μm.

Further, when instead of Al, Fe and Cr were used, respectively, it was possible to grow crystals in the same manner. Furthermore, when instead of $K_2O$, $Rb_2O$ and $Cs_2O$ were used, the corresponding crystals were obtained, respectively.

EXAMPLE 11

(1) Preparation of single crystals

Powders of potassium carbonate, titanium oxide and gallium oxide each having a purity of 99.9%, were mixed to obtain a crystal material having a molar ratio of $(K_2O)_{0.7}(TiO_2)_{1.0}(Ga_2O_3)_{0.5}$. On the other hand, potassium carbonate and molybdenum oxide were mixed to obtain a flux material having a molar ratio of $(K_2O)_{1.0}(MoO_3)_{1.5}$. Then, the crystal material and the flux material were mixed in a mol % of 20:80.

Then, 130 g of the mixture thus obtained was put into a platinum cruicible, and melted by heating at 1300° C. for about 10 hours in a silicon carbide heater electric furnace. Then, the melt was gradually cooled to a temperature of about 1000° C. at a rate of 4° C./hr. Then, the cruicible was taken out from the electric furnace and left to cool down to room temperature. Then, the flux was dissolved by boiling water, and the crystals were separated.

The crystals thus obtained, were light gray needle-like crystals elongated in the direction of the c-axis of the crystals. The average size of these needle-like crystals was such that the diameter was 0.1 mm and the length was 5 mm. From the chemical analysis, the crystals were found to be $K_{1.0}[Ga_8Ga_9Ti_{15}O_{56}]$.

Further, when $Rb_2CO_3$ is used instead of $K_2CO_3$, similar needle-like crystals of $Rb_{1.0}[Ga_8Ga_9Ti_{15}O_{56}]$ can be obtained, and likewise if $Cs_2CO_3$ is used, needle-like crystals of $Cs_{1.0}[Ga_8Ga_9Ti_{15}O_{56}]$ can be obtained.

(2) Measurement of the ion conductivity

The conductive mechanism of one dimensional ion conductor of the compound of the present invention is explained by a theory which is different from the conductive mechanism of the conventional $\beta$-alumina. Namely, it can be explained that K ions present in one dimensional tunnel-structures move within the region defined by rundom potential walls.

The conductivity may be represented by the following complex conductivity $\sigma$, and the electrically equivalent circuit for the analysis of the measured values is shown in FIG. 2:

$$\sigma = i\omega\epsilon_{fw}\epsilon_o + \frac{i\omega\epsilon_p\epsilon_o \cdot C(i\omega)^\nu}{i\omega\epsilon_p\epsilon_o + C(i\omega)^\nu}$$

In FIG. 2:
  $\epsilon_p$ = Polarization of ions in the tunnel
  $\epsilon_o$ = Dielectric constant of vacuum
  $\epsilon_{fw}$ = Dielectric constant relating to the framework of the tunnel-structure
  $\omega$ = Angular frequency
  i = Imaginary number
  C = Constant of the conductivity function of one dimensional conduction
  $(i\omega)^\nu$ = Frequency dependent term of the conductivity function of one dimensional conduction By using a gold vapor deposition layer as an electrode, the conductivity can be obtained by an alternate current measurement under a condition for blocking K ions. With respect to the crystals obtained in the above item (1) i.e. with respect to the test sample grown in the direction of the c-axis of the crystal and having a length of 5 mm and a diameter of 0.1 mm, the actual number portion and the imaginary number portion of the alternate current complex conductivity from $10^2$ Hz to 325 Hz were obtained by means of a broad-band impedance measuring apparatus and a microwave standing wave method. The results of the measurement are as follows.

| Temp. (K) | Real number portion (S cm$^{-1}$) | Imaginary number portion (S cm$^{-1}$) |
| --- | --- | --- |
| (1) Conductivity at $10^7$ Hz | | |
| 174 | $3 \times 10^{-4}$ | $6 \times 10^{-3}$ |
| 212 | $1 \times 10^{-4}$ | $7 \times 10^{-3}$ |
| 254 | $1 \times 10^{-4}$ | $8 \times 10^{-3}$ |
| (2) Conductivity at 32.5 GHz | | |
| 174 | 1.4–2.2 | 2.4 |
| 212 | 2.1–3.3 | 2.0 |
| 254 | 2.8–4.1 | 2.0 |

From the above results, it is evident that the compound of the present invention has the following features.

The ion conductivity of the compound of the present invention is largely dependent on the frequency. It shows extremely high ion conductivity at a high frequency region. There has been no ion conductor comparable to this compound.

Further, the temperature dependency is extremely small, and the active energy is very small at a level of 0.048 eV. There has been no ion conductor comparable to this.

Further, when instead of K ions, Rb ions or Cs ions were used, or a solid solution of K or Rb with Li or Na was used, the products had similar ion conductivity.

Furthermore, when a part of Ti was replaced by Mn, or when a part of Ga was replaced by Al, Fe or Cr, similar ion conductivity was obtained.

EXAMPLE 12

Preparation of $K_{1.0}[Ga_8Ga_9Ti_{15}O_{56}]$ crystalline powder

Powders of potassium carbonate, titanium dioxide and gallium oxide were mixed in a molar ratio of $K_2CO_3:TiO_2:Ga_2O_3=0.5:15:8.5$. Then, 6 g of this mixture was put into a platinum crucible, and provisionally sintered at 1200° C. for 30 minutes. This provisionally sintered product was pulverized and mixed, and further sintered at 1200° C. for 15 hours. The crystals thus obtained were $K_{1.0}[Ga_8Ga_9Ti_{15}O_{56}]$ crystalline powder.

Further, by chaging the amount of the potassium component, various products having a composition of the formula $K_x[Ga_8Ga_{8+x}Ti_{16-x}O_{56}]$ wherein x is within a range of from 0.5 to 2.0, were obtained.

EXAMPLE 13

Preparation of $Rb_{1.0}[Ga_8Ga_9Ti_{15}O_{56}]$ crystalline powder

Powders of rubidium carbonate, titanium dioxide and gallium oxide were mixed in a molar ratio of $Rb_2CO_3:TiO_2:Ga_2O_3=0.5:15:8.5$. The mixture thus obtained was sintered in the same manner as in Example 12. The crystals thus obtained had a composition of $Rb_{1.0}[Ga_8Ga_9Ti_{15}O_{56}]$.

Further, by changing the amount of the rubidium component, various products having a composition of the formula $Rb_x[Ga_8Ga_{8+x}Ti_{16-x}O_{56}]$ wherein x is within a range of from 0.5 to 2.0, were obtained.

EXAMPLE 14

Preparation of $Cs_{1.0}[Ga_8Ga_9Ti_{15}O_{56}]$ crystalline powder

Powders of cesium carbonate, titanium dioxide and gallium oxide were mixed in a molar ratio of $CsCO_3:TiO_2:Ga_2O_3=0.5:15:8.5$, and the mixture was sintered in the same manner as in Example 12. The crystals thus obtained had a composition of $Cs_{1.0}[Ga_8Ga_9Ti_{15}O_{56}]$. Further, by changing the cesium component, various products having a composition of the formula $Cs_x[Ga_8Ga_{8+x}Ti_{16-x}O_{56}]$ wherein x was within a range of from 0.5 to 2.0, were obtained in the same manner.

EXAMPLE 15

Preparation of $K_{1.0}Na_{1.0}[Ga_8Ga_{10}Ti_{14}O_{56}]$ crystalline powder

Powders of potassium carbonate, sodium carbonate, titanium dioxide and gallium oxide were mixed in a molar ratio of $K_2CO_3:NaCO_3:TiO_2:Ga_2O_3=0.5:0.5:14:9$. Then, about 6 g of this mixture was provisionally sintered at 1200° C. for 30 minutes in a platinum cruicible. This provisionally sintered product was pulverized and mixed, and further sintered at 1200° C. for 15 hours. The obtained product was $K_{1.0}Na_{1.0}[Ga_8Ga_{10}Ti_{14}O_{56}]$ crystalline powder containing potassium and sodium in the form of a solid solution.

Further, when lithium carbonate or barium carbonate is used instead of sodium carbonate, a solid solution of potassium and lithium, or potassium and barium, can be obtained.

Furthermore, when rubidium carbonate or cesium carbonate is used instead of potassium carbonate, a solid solution of rubidium and sodium, cesium and sodium, rubidium and lithium, rubidium and barium, cesium and lithium, or cesium and barium, can be obtained.

EXAMPLE 16

Preparation of $K_{1.3}[Ga_8Ga_{9.3}Ti_{14.7}O_{56}]$ fiber

Powders of potassium carbonate, titanium dioxide and gallium oxide were mixed in a molar ratio of $(K_2O)_{0.7}(TiO_2)_{1.0}(Ga_2O_3)_{0.5}$ to obtain a crystal material. On the other hand, powders of potassium carbonate and molybdenum oxide were mixed in a molar ratio of $(K_2O)(MoO_3)_{1.5}$ to obtain a flux material. Then, 20 mol % of the crystal material and 80 mol % of the flux material were mixed, and 123 g of this mixture was dissolved by heating at 1300° C. in a platinum cruicible. The melt was maintained at this temperature for about 10 hours, and then gradually cooled to 1000° C. at a rate of 4° C./hr.

The cruicible was immersed in boiling water to dissolve the flux and fibers wer separated. The fibers thus obtained were aggregates of single crystals having a length of 10 mm and a diameter of 0.1 mm. By the powder X-ray diffractometry and chemical analysis, the product was confirmed to be $K_{1.3}[Ga_8Ga_{9.3}Ti_{14.7}O_{56}]$.

Further, when rubidium carbonate or cesium carbonate is used instead of potassium carbonate, $Rb[Ga_8Ga_{9.3}Ti_{14.7}O_{56}]$, or $Cs_{1.3}[Ga_8Ga_{9.3}Ti_{14.7}O_{56}]$ can be obtained in the same manner.

Melting temperatures

The melting temperatures were measured by means of a super high temperature type apparatus for differential thermal analysis. The results are as follows.

| Fibers | Melting points |
|---|---|
| $K_{1.3}[Ga_8Ga_{9.3}Ti_{14.7}O_{56}]$ fibers | 1540 ± 15° C. (Decomposed) |
| $Rb_{1.3}[Ga_8Ga_{9.3}Ti_{14.7}O_{56}]$ fibers | 1560 ± 15° C. (Not decomposed) |
| $Cs_{1.3}[Ga_8Ga_{9.3}Ti_{14.7}O_{56}]$ fibers | 1560 ± 15° C. (Decomposed) |
| Conventional $K_2Ti_6O_{13}$ fibers | 1370 ± 15° C. (Not decomposed) |

As is evident from the above results, the products of the present invention have very high melting points, thus indicating high heat resistance.

Thermal conductivity

The thermal conductivity k is obtained as the product of the specific heat capacity ($C_p$), the thermal conductivity ($\alpha$) and the density ($\rho$).

$$k = \rho \cdot C_p \alpha$$

$\rho$ was calculated from the size and the weight of the sintered test sample, and $C_p$ and $\alpha$ were measured by a laser flash method.

SAMPLE I

Sample of $K_{1.0}[Ga_8Ga_9Ti_{15}O_{56}]$: Sintered product having a thickness of 2.96 mm, an outer diameter of 10 mm, and a density of 4.43 g.cm$^{-3}$

SAMPLE II

Sample of $Rb_{1.0}[Ga_8Ga_9Ti_{15}O_{56}]$: Sintered product having a thickness of 2.12 mm, an outer diameter of 10.1 mm, and a density of 4.69 g.cm$^{-3}$

SAMPLE III

Sample of $Cs_{1.0}[Ga_8Ga_9Ti_{15}O_{56}]$: Sintered product having a thickness of 2.05 mm, an outer diameter of 10.17 mm, and a density of 4.54 g.cm$^{-3}$ The specific heat capacities ($C_p$), the thermal diffusivities $\alpha$ and the thermal conductivities k of the above Samples were measured at room temperature and at 675° C. The results were as follows.

| | $C_p(J \cdot g^{-1} \cdot K^{-1})$ Room temp.675° C. | $\alpha(cm^2 \cdot S^{-1})$ Room temp.675° C. | $k(W \cdot cm^{-1} \cdot K^{-1})$ Room temp.675° C. |
|---|---|---|---|
| Sample | | | |
| Sample I | 0.56, 0.77 | 0.009, 0.007 | 0.022, 0.024 |
| Sample II | 0.45, 0.56 | 0.005, 0.004 | 0.011, 0.011 |
| Sample III | 0.46, 0.54 | 0.008, 0.005 | 0.017, 0.012 |
| Conventional | | | |
| $K_2Ti_6O_{13}$ | 0.71, 0.98 | 0.015, 0.006 | 0.038, 0.021 |

As is evident from the above results, the products of the present invention have low thermal conductivities at a level of substantially equal to the thermal conductivity of the conventional potassium hexatitanate. It is particularly noteworthy that they show extremely low thermal conductivities even at high temperatures.

Thus, the heat resistant heat insulating material of the present invention has a melting point (1560° C.) substantially higher than the melting point (1370° C.) of potassium hexatitanate which is regarded as most excellent in the heat insulating property among conventional ceramics, and has the heat resistance improved as much as 200° C. over the potassium hexatitanate. At the same time, the thermal conductivity is as small as the potassium hexatitanate, and it has excellent heat insulating properties.

What is claimed is:

1. A tetragonal system tunnel-structured compound having the formula:

$$A_x[Ga_8M_yGa_{(8+x)-y}Ti_{16-x}O_{56}] \quad (I)$$

wherein A is at least one alkali metal selected from the group consisting of K, Rb and Cs, or a solid solution of such alkali metal with lithium, sodium or barium, M is at least one trivalent metal selected from the group consisting of Al, Fe and Cr, x is a number of from 0.1 to 2.0, and y is a number of from 0 to 10.

2. The compound according to claim 1, which has the $$A_x[Ga_8Ga_{8+x}Ti_{16-x}O_{56}]$$

wherein A and x are as defined in claim 1.

3. The compound according to claim 2, wherein up to 50% of Ti is substituted by Mn.

4. A method for preparing a tetragonal system tunnel-structured compound having the formula:

$$A_x[Ga_8M_yGa_{(8+x)-y}Ti_{16-x}O_{56}] \quad (I)$$

wherein A is at least one alkali metal selected from the group consisting of K, Rb and Cs, or a solid solution of such alkali metal with lithium, sodium or barium, M is at least one trivalent metal selected from the group consisting of Al, Fe and Cr, x is a number of from 0.1 to 2.0, and y is a number of from 0 to 10, which comprises mixing an alkali metal oxide selected from the group consisting of $K_2O$, $Rb_2O$ and $Cs_2O$ or a compound decomposable into such an alkali metal oxide when heated, titanium oxide or a compound decomposable into titanium oxide when heated, gallium oxide or a compound decomposable into gallium oxide when heated, and a trivalent metal compound selected from the group consisting of aluminum oxide, iron oxide and chromium oxide, or a compound decomposable into such a trivalent metal oxide when heated, to have a composition represented by the formula:

$$A_x[Ga_8M_yGa_{(8+x)-y}Ti_{16-x}O_{56}]$$

wherein A, M, x and y are as defined above, and sintering the mixture at a temperature of at least 1000° C.

5. A method for preparing a tetragonal system tunnel-structured compound having the formula:

$$A_x[Ga_8M_yGa_{(8+x)-y}Ti_{16-x}O_{56}] \quad (I)$$

wherein A is at least one alkali metal selected from the group consisting of K, Rb and Cs, or a solid solution of such alkali metal with lithium, sodium or barium, M is at least one trivalent metal selected from the group consisting of Al, Fe and Cr, x is a number of from 0.1 to 2.0, and y is a number of from 0 to 10, which comprises mixing an alkali metal oxide selected from the group consisting of $K_2O$, $Rb_2O$ and $Cs_2O$, or a compound decomposable into such an alkali metal oxide when heated, $TiO_2$ or a compound decomposable into $TiO_2$ when heated, $Ga_2O_3$ or a compound decomposable into $Ga_2O_3$ when heated, and a trivalent metal oxide selected from the group consisting of $Al_2O_3$, $Fe_2O_3$ and $Cr_2O_3$, or a compound decomposable into such a trivalent metal oxide when heated, to obtain a crystal material having a composition represented by the formula:

$$(A_2O)_a(TiO_2)_b(M_2O_3)_c(Ga_2O_3)_d$$

wherein A and M are as defined above, each of a and b is a number of from 0.1 to 2.0, c is a number of from 0 to 1.0, and d is a number of from 0.1 to 1.0, mixing $MoO_3$ or a compound decomposable into $MoO_3$ when heated, and an alkali metal oxide selected from the group consisting of $K_2O$, $Rb_2O$ and $Cs_2O$, or a compound decomposable into such an alkali metal oxide when heated, to obtain a flux material having a composition represented by the formula:

$$A_2O \cdot n(MoO_3)$$

wherein A is as defined above, and n is a number of from 1 to 2, then mixing the crystal material and the flux material in a molar ratio of from 30:70 to 10:90, heating and melting the mixture at a temperature of from 1200° to 1400° C., and gradually cooling the melt to a temperature of from 900° to 1000° C. to let a single crystal grow.

6. A cation conductor material consisting essentially of the compound as defined in claim 1.

7. A heat resistant heat insulating material consisting essentially of the compound as defined in claim 1.

8. The method according to claim 4, wherein said compound decomposable into said alkali metal oxide, gallium oxide, titanium oxide or said trivalent metal oxide when heated is selected from the group consisting of the respective metal carbonates, percarbonates, hydroxides, nitrates, halides and oxyhalides.

9. The method according to claim 5, wherein said compound decomposable into said alkali metal oxide, gallium oxide, titanium oxide or said trivalent metal oxide when heated is selected from the group consisting of the respective metal carbonates, percarbonates, hydroxides, nitrates, halides and oxyhalides.

10. The tetragonal system tunnel-structured compound according to claim 1, wherein x is from 0.6 to 1.2.

11. The tetragonal system tunnel-structured compound according to claim 1, wherein said alkali metal is K, Rb or a solid solution of K or Rb with Li or Na.

12. The cation conductor material according to claim 6, which is in a crystalline form having a face perpendicular to the axis of the tunnel structure which is well-developed.

13. The cation conductor material according to claim 12, which is a needle-shaped or fiber-shaped single crystal extending in parallel with the c-axis of the crystal.

14. The heat resistant heat insulating material according to claim 7, which is in a crystalline form.

* * * * *